(12) United States Patent
Pilat et al.

(10) Patent No.: US 10,998,852 B2
(45) Date of Patent: May 4, 2021

(54) PHOTOVOLTAIC SOLAR ENERGY SYSTEM WITH IMPROVED GAIN

(71) Applicant: COMMISSARIAT À L'ÉNERGIE ATOMIQUE ET AUX ÉNERGIES ALTERNATIVES, Paris (FR)

(72) Inventors: Eric Pilat, Brison-Saint-Innocent (FR); José Sayritupac Vera, Chambery (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 205 days.

(21) Appl. No.: 16/183,939

(22) Filed: Nov. 8, 2018

(65) Prior Publication Data

US 2019/0140587 A1 May 9, 2019

(30) Foreign Application Priority Data

Nov. 9, 2017 (FR) ...................................... 1760540

(51) Int. Cl.
*H02S 40/22* (2014.01)
*H02S 20/30* (2014.01)
*H02S 20/10* (2014.01)
*H01L 31/068* (2012.01)

(52) U.S. Cl.
CPC .......... *H02S 40/22* (2014.12); *H01L 31/0684* (2013.01); *H02S 20/10* (2014.12); *H02S 20/30* (2014.12)

(58) Field of Classification Search
CPC .......... H02S 40/22; H02S 20/30; H02S 20/10; H01L 31/0684
See application file for complete search history.

(56) References Cited

U.S. PATENT DOCUMENTS

| | | | |
|---|---|---|---|
| 2008/0121273 A1* | 5/2008 | Plaisted | F24S 25/70 136/251 |
| 2010/0212720 A1 | 8/2010 | Meyer et al. | |
| 2013/0220401 A1* | 8/2013 | Scheulov | H01L 31/0525 136/246 |
| 2017/0063295 A1* | 3/2017 | Panish | H02S 40/22 |
| 2017/0257059 A1 | 9/2017 | Kutzer et al. | |

OTHER PUBLICATIONS

Search Report for French Application No. 17 60540 dated Jun. 28, 2018.

* cited by examiner

*Primary Examiner* — Matthew T Martin
(74) *Attorney, Agent, or Firm* — Pearne & Gordon LLP

(57) ABSTRACT

In order to improve the gain of a photovoltaic solar energy system, the system comprises: a plurality of bifacial photovoltaic solar cells, defining together a direct absorption surface as well as an indirect absorption surface, both surfaces being opposite and intended to absorb a solar radiation energy; a support chassis for supporting the cells, the chassis comprising a support structure on which the cells are attached. The chassis further includes a suspension for suspending the support structure, the suspension comprising a top end connected to a first end of the support structure, and the suspension defines a reflective surface configured to reflect light towards the indirect absorption surface defined by the cells.

7 Claims, 4 Drawing Sheets

PHOTOVOLTAIC SOLAR ENERGY SYSTEM WITH IMPROVED GAIN

CROSS-REFERENCE TO RELATED APPLICATIONS

This application claims priority from French Patent Application No. 17 60540 filed on Nov. 9, 2017. The content of this application is incorporated herein by reference in its entirety.

TECHNICAL FIELD

The present invention relates to the field of photovoltaic solar energy, and in particular to systems comprising bifacial photovoltaic solar cells.

The invention is in particular applied to systems to be placed on the ground or on building roofs.

STATE OF PRIOR ART

From prior art, it is known to make systems comprising photovoltaic solar cells having a bifacial nature, these cells being gathered within photovoltaic panels. The interest of such cells resides in the fact that they define in a front face a direct absorption surface for absorbing a solar radiation energy, and, in a rear face, an indirect absorption surface also for absorbing a solar radiation energy.

Several embodiments have already been contemplated for achieving this type of system. It is for example known document CN 204993212, in which systems equipped with panels comprising bifacial photovoltaic cells, downwardly extended by reflectors are described. Each reflector is tilted to allow the rear surface of the cells of another system located more forwardly to be irradiated.

This design type has however many drawbacks, at the top of the priorities list of which the requirement to make a system cooperate with at least one another system located forwardly, in order to illuminate its rear indirect absorption surface. The use of this type of system thus remains restricted to solar power plants having a plurality of rows of systems. Moreover, the distance between each row becomes a parameter dependent on this need for irradiation of the rear surface by the systems of the rear row, such that the ground space of the power plant can turn out to be non-optimised. The same is true of the space along the vertical direction, because of the requirement to provide sufficiently lifted chassis to allow reflectors to be implanted at the bottom of the solar panels.

Finally, this design does not enable the reflector to return light along an optimum direction on the rear face of the front system, which brings about energy losses as well as an undesirable irradiation heterogeneity.

SUMMARY OF THE INVENTION

The purpose of the invention is thus to overcome at least partially the abovementioned drawbacks, relative to the embodiments of prior art.

To that end, a first object of the invention is a photovoltaic solar energy system including:
- a plurality of bifacial photovoltaic solar cells, defining together a direct absorption surface as well as an indirect absorption surface, both surfaces being opposite and intended to absorb a solar radiation energy;
- a chassis for supporting said cells, said chassis comprising a support structure on which the cells are attached.

According to the invention, said chassis further includes a means for suspending the support structure, the suspension means comprising a top end connected to a first end of the support structure, and the suspension means defining a reflective surface configured to reflect light towards said indirect absorption surface defined by the plurality of cells.

The invention is therefore in contrast with prior embodiments essentially in that it contemplates to associate a reflector function with at least one part of the chassis. Because of the design proposed, the system turns out to be advantageously autonomous. Indeed, its indirect absorption surface is irradiated with light which is reflected on the reflective surface of the suspension means, such that it does not need to cooperate with another system located rearward of it. Consequently, not only the system can be used autonomously, but in case of use in a power plant with several rows, the distance between rows can be set much more freely than in the previously described prior art. It is the overall space of the power plant which is thereby advantageously reduced.

Further, by virtue of the attachment of the suspension means and the support structure at their ends, the entire indirect absorption surface, carried by the support structure, can thus be readily lighted with an optimum direction of the reflected rays. The solar irradiation of the cells thus becomes maximum, and the lighting homogeneity between both surfaces is widely improved.

In order to further improve irradiation, according to the invention, the support chassis further includes an input reflector a first end of which is connected to a bottom end of the suspension means, the input reflector defining a reflective input surface configured to reflect light towards said reflective surface defined by the suspension means. Moreover, said indirect absorption surface, the reflective surface, as well as the reflective input surface delimit together a light reflection and propagation space open between a second end of the input reflector opposite to the first end of this reflector, and a second end of the support structure opposite to the first end of this structure.

The invention also provides the following optional characteristics, taken alone or in combination.

The support chassis further includes a moving device for pivoting the whole formed by the suspension means and the support structure, and the moving device includes a telescopic arm one end of which is hinged to the input reflector. This feature is adopted in order to be oriented at best with respect to the sun, at any time, with a low overall space. This pivoting is preferably made along an axis of rotation substantially parallel to the ground, and substantially parallel to a junction line between the support structure and the suspension means.

The input reflector, the support structure as well as the suspension means are each of a substantially planar shape, and they preferably have substantially the same width along a width direction L3 parallel to junction lines between these three aforementioned elements. On the other hand, the cells are also preferably substantially planar.

Preferably, the input reflector is tilted by an angle substantially equal to 90° with respect to the suspension means, and the latter is tilted by an angle substantially equal to 45° with respect to the support structure. This geometry is such that, when light rays perpendicularly impact the direct absorption surface, the rays reflected by the reflector and the suspension means then perpendicularly impact the indirect absorption surface. This impact direction brings about an energy gain and enhances the irradiation homogeneity of the indirect absorption surface.

Preferably, the input reflector has, between its first and second ends, a length "L1" substantially identical to the length of the suspension means between its top and bottom ends, and the support structure has between its first and second ends a length "L2" such that the L1 squared value is substantially equal to twice the L2 squared value.

Preferably, said suspension means also defines an additional reflective surface, this additional surface being preferentially opposite/leaning back against said reflective surface. In this manner, the suspension means can advantageously return light towards the direct absorption surface of a system located rearwardly.

Finally, said suspension means comprises at least one of the following elements:
- a framework on which a net forming a reflective element is attached;
- a framework on which a set of parallel lamellae forming a reflective element is attached;
- one or more reflective panels, for example through which apertures equipped with wind energy recovering means pass.

Another object of the invention is a solar power plant comprising a plurality of systems as that described above, said systems being arranged so as to form a plurality of rows.

Further advantages and characteristics of the invention will appear in the non-limiting detailed description below.

BRIEF DESCRIPTION OF THE DRAWINGS

This description will be made with regard to the appended drawings in which.

DETAILED DESCRIPTION OF PARTICULAR EMBODIMENTS

Figure 1:
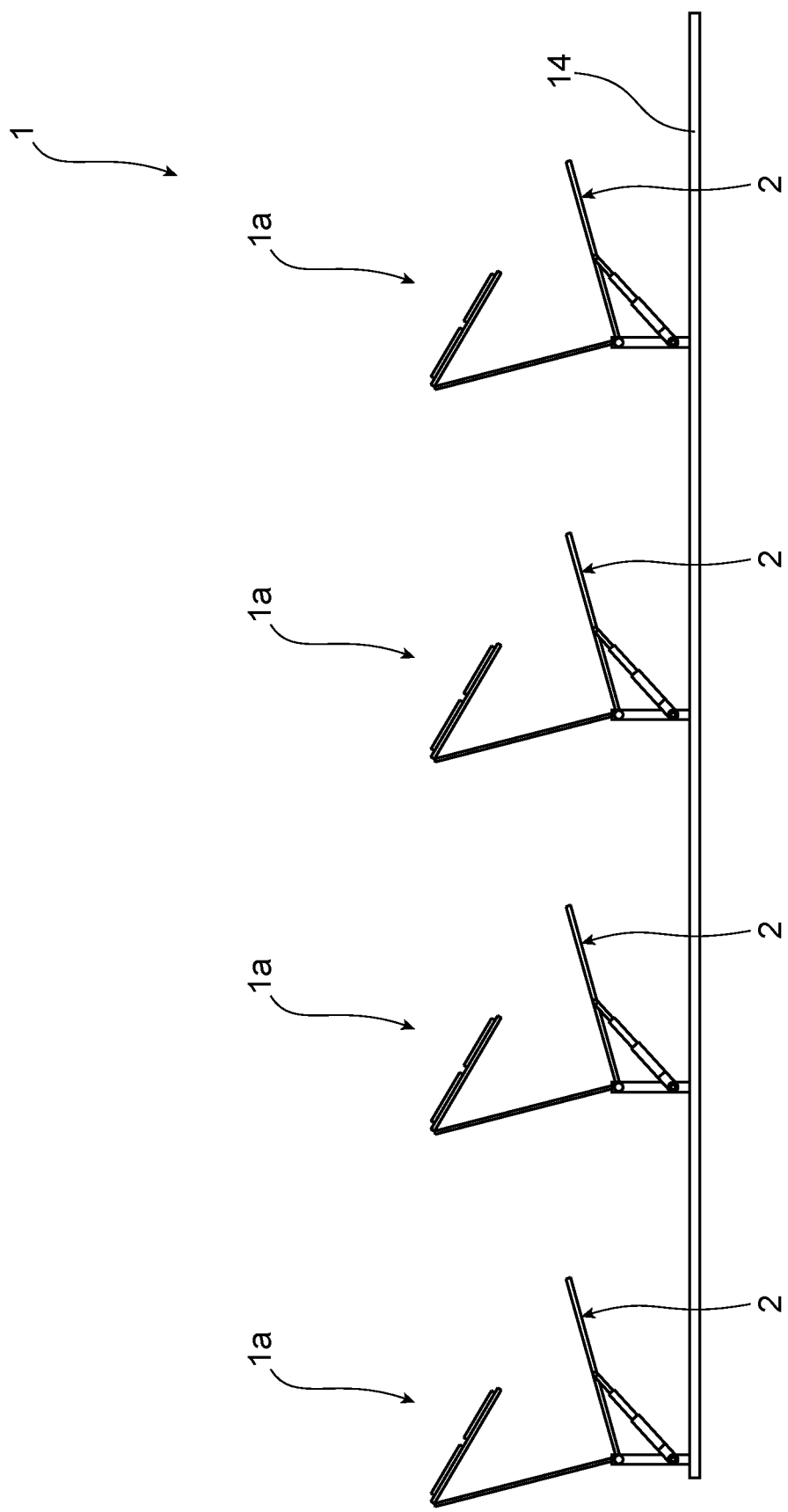
FIG. 1 represents a side view of a solar power plant, comprising rows each formed by a plurality of systems according to one preferred embodiment of the invention.

First in reference to FIG. 1, a solar power plant 1 having a plurality of rows 1a, preferably parallel to each other, and each including several photovoltaic solar energy systems 2 arranged side by side is represented.

Figure 2:
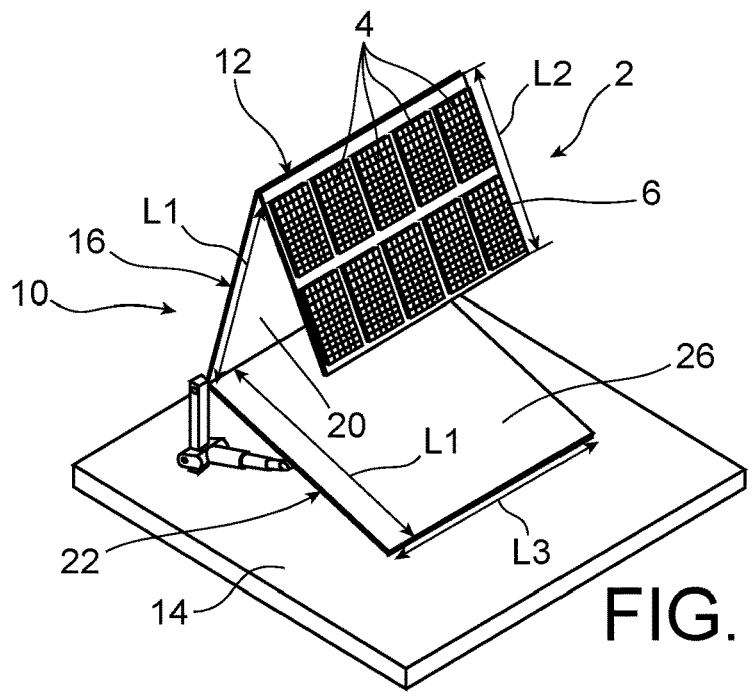
FIG. 2 is a perspective view of one of the systems shown in the preceding Fig.
Figure 3:
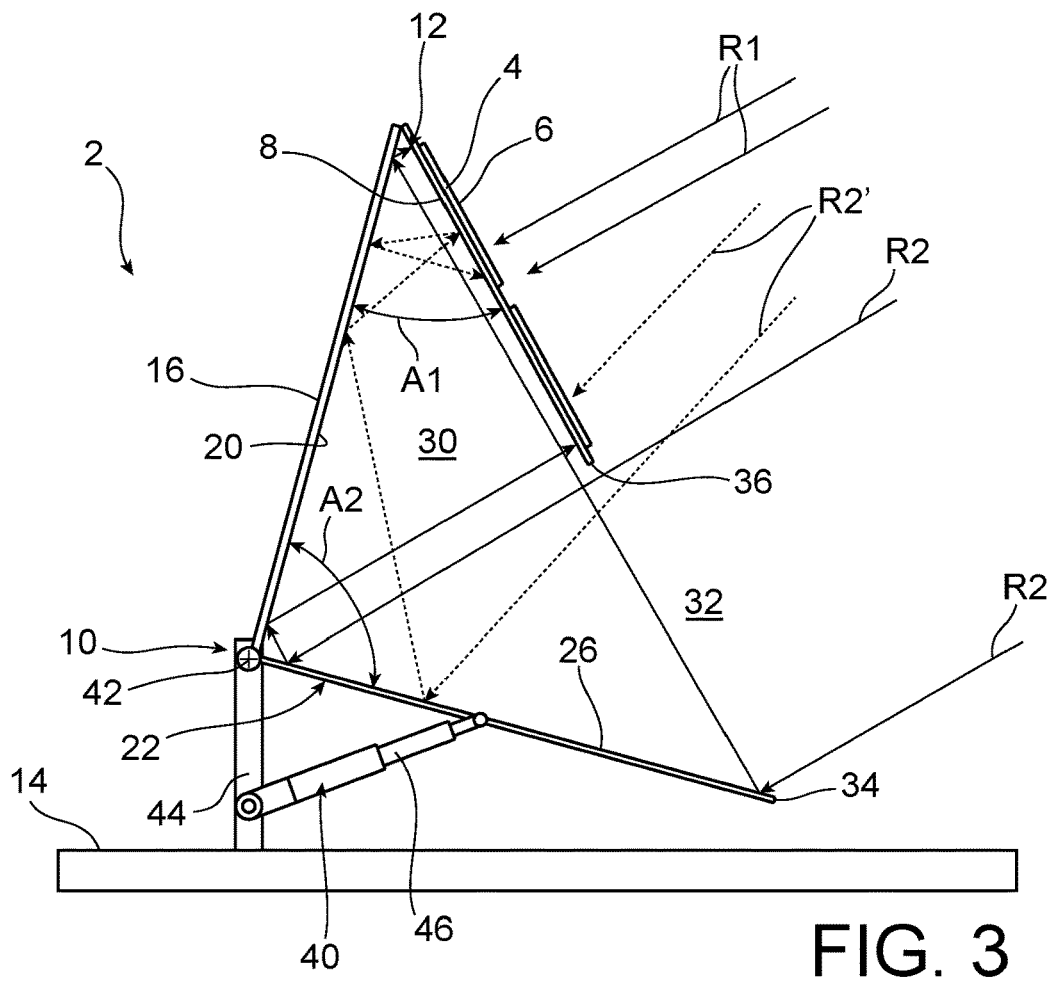
FIG. 3 represents a view from the side of that of the preceding Fig., depicting the operation of the system.

In reference to FIGS. 2 and 3, one of these systems 2 is represented, according to a preferred embodiment of the invention. In this regard, it is noted that all the systems of the solar power plant are identical or similar. These systems are attached to the ground 14, each using their chassis which will be subsequently described. In other applications, one or more systems can be used in order to be arranged on a building roof.

In the embodiment of FIGS. 2 and 3, the system 2 first includes a plurality of solar cells 4. These photovoltaic solar cells are of a bifacial nature, so as to define together in a front face a direct absorption surface 6, as well as in a rear face, an indirect absorption surface 8. Both surfaces 6, 8 are conventionally substantially planar and parallel to each other, even if another embodiment could be contemplated by providing that both surfaces are not parallel to each other. The solar cells 4 can be gathered by panels, as is visible in particular in FIG. 2. In this mode, it is indeed possible to observe ten panels equipping a same system 2. These panels are arranged substantially in a same plane, and all supported by a support chassis 10, specific to the invention.

First, the chassis 10 comprises a support structure 12 for supporting the cells 4. This support structure can be conventionally made, for example using a frame, possibly completed with reinforcing elements, while remaining between them a sufficiently emptied space to allow both surfaces 6, 8 to be irradiated with light. The density of the cells 4 is strong, because their cumulative surface area substantially corresponds to the surface area of the structure 12 as defined by its periphery.

At a first end of this support structure 12, corresponding to a top end substantially parallel to the ground 14, the chassis includes a suspension means 16 for suspending the support structure 12. The suspension means 16 is also of a substantially planar shape. Its top end is mechanically connected to the top end of the support structure 12, so as to form a fold line between both. The angle A1 defined between both elements 12, 16 is preferentially substantially equal to 45°, and more generally between 30 and 60°.

One of the features of the present invention resides in the fact that the surface of the suspension means which is oriented towards the indirect absorption surface 8, is a reflective surface 20 configured to reflect light towards this surface 8.

An input reflector 22, a first end of which is mechanically connected to a bottom end of the suspension means 16 is also provided. The input reflector 22 is also of a substantially planar shape, and defines with the suspension means 16 an angle A2 substantially equal to 90°. It has an input reflective surface 26 configured to reflect light towards the reflective surface 20 of the suspension means 16.

The suspension means 16, the support structure 12, and the input reflector 22 all extend over a substantially identical width, the direction of the width L3 being here considered as parallel to the junction lines between these three elements 12, 16, 22. On the other hand, the length L1 of the input reflector 22, between both these ends, is substantially identical to the length of the suspension means 16 between its top end and its bottom end. Moreover, between its first and second ends, the support structure 12 has a length L2 defined such that the L1 squared value is substantially equal to twice the L2 squared value. Consequently, the three surfaces 8, 20, 26 define together a light reflection and propagation space 30, an aperture 32 of which is delimited between a second end 34 of the input reflector 22, and the second end 36 of the support structure 12, considered as the bottom end of this structure.

The aperture 32 thus extends along a half-hypotenuse length of the hypothetical right angled triangle formed by the elements 12, 16, 22, the other half-hypotenuse consisting of the support structure 12.

With this particular geometry of the chassis 10, in side view, light rays R1 substantially impact perpendicularly the direct absorption surface 6. This particular orientation is obtained by virtue of a moving device 40 being an integral part of the chassis 10, which connects the aforementioned elements 12, 16, 22 to the ground 14. This device 40 enables these integral elements to be rotated, along an axis of rotation 42 substantially parallel to the ground 14 and substantially parallel to the junctions between the elements of the chassis. Preferably, the axis of rotation 42 is located at the junction between the suspension means 16 and the input reflector 22. The device 40 includes for example one or more vertical arms 44 connecting the ground 14 to the aforementioned junction, and also comprises one or more telescopic arms 46 a first end of which is connected to the fixed arms 44, and a second end of which is hinged to the input reflector 22. By virtue of this device 40, it is actually easy to drive the orientation of the chassis 10 such that the direct absorption surface 6 is at any time of the daytime substantially perpendicular to the rays R1. This device 40 enables for example the whole to perform a pivoting with a total amplitude of 30 to 60° about the axis of rotation 42.

Although this has not been represented, the chassis could also include a device rotating about a vertical axis, in order to follow the solar azimuth.

Further, light rays R2 penetrate through the aperture 32 in the space 30, as has been depicted in FIG. 3. These rays R2 are reflected on the input reflective surface 26, and then on the reflective surface 20, before impacting substantially perpendicularly the indirect absorption surface 8, on the entire surface thereof. In the case where the chassis 10 could not be oriented to bring the rays R2 perpendicularly to the surface 8 in the side view, for example in case of the absence of the moving device 40, the rays R'2 represented as a dotted line in FIG. 3 would be trapped anyway in the space 30 after passing through the aperture 32. In this case, there is a rebound effect amenable to a satisfactory irradiation of the indirect absorption surface 8.

Figure 4:
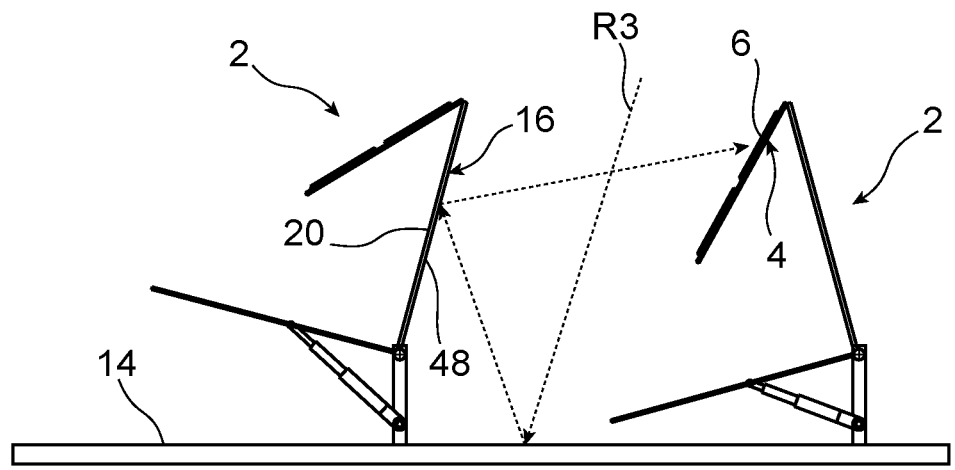
FIG. 4 represents a side view of both systems located one in front the other, these systems having the form of another preferred embodiment of the invention.

According to another embodiment shown in FIG. 4, the suspension means 16 has, opposite to its reflective surface 20, an additional reflective surface 48 the function of which consists in irradiating the direct absorption surface 6 of another system located rearwardly. Indeed, light rays R3 impact the ground 14 between two systems 2, and then are reflected first on the additional reflective surface 48 at the rear of the suspension means 16 of the front system, and then impact the direct absorption surface 6 of the cells of the rear system. The gain of the solar power plant is thereby advantageously increased.

Figure 5:
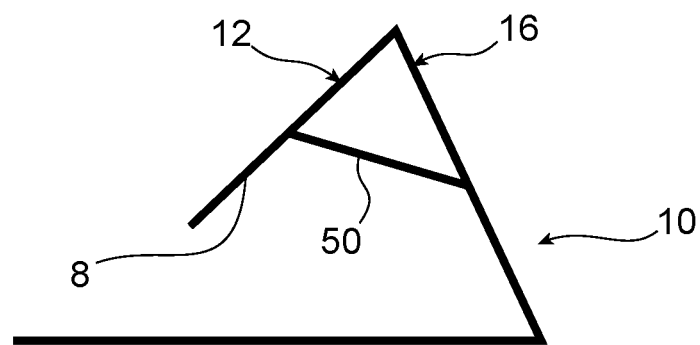
FIG. 5 represents a side schematic view of a system still having the form of another preferred embodiment of the invention.

FIG. 5 shows one embodiment in which one or more reinforcing bars 50 can complete the chassis 10, by connecting the suspension means 16 to the support structure 12. However, their number and cross-section remain limited, not to restrict too much the irradiation extent of the indirect absorption surface 8.

Figure 6A:
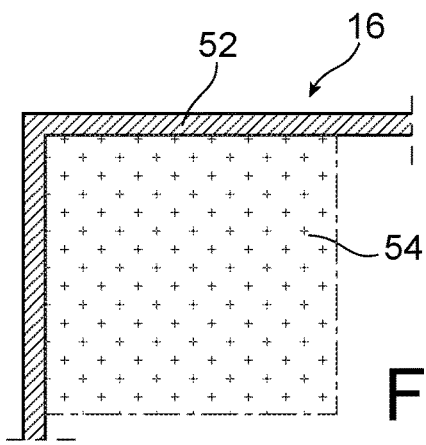
FIGS. 6a to 6c depict different possible embodiments for the suspension means being an integral part of the systems shown in the preceding figures.
Figure 6B:
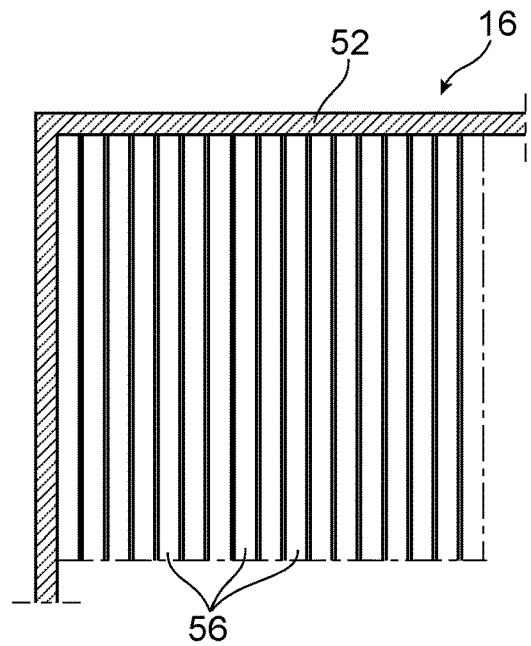
Figure 6C:
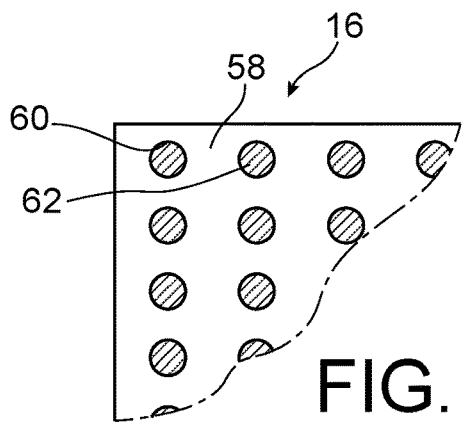

Finally, FIGS. 6a to 6c show different possibilities to make the suspension means 16. According to a first embodiment shown in FIG. 6a, a framework 52 forming the periphery of the means 16 is provided. A net 54 is attached to this framework, which net thereby has apertures in order to leave wind to pass, thus reducing the pressure strain applied to the suspension means 16. In the example shown, the net is a camouflage net commonly employed in the military sector, preferably of a white colour in order to promote optical reflection.

According to another embodiment shown in FIG. 6b, the framework 52 carries parallel lamellae 56 which form reflective elements. Once again, the spaces provided between the lamellae allow wind to pass through the means 16 without exerting too high pressure strains. These lamellae 56, looking like a jalousie, can be made using a white polymeric composite, as for example products marketed by the Dupont® company, as TPT® or Tedlar®.

Alternatively, the suspension means 16 could be solid, and designed to resist the pressure strain resulting from wind. However, a third improved embodiment consists in providing one or more reflective panels 58, of a structural nature or secured to a framework, as shown in FIG. 6c. Each panel 58 thereby would include several apertures 60 equipped with wind energy recovering means, as mini-wind turbines 62 only schematically represented in FIG. 6c.

Of course, various modifications can be provided by those skilled in the art to the invention just described, only by way of non-limiting examples.

The invention claimed is:

1. A photovoltaic solar energy system including:
    a plurality of bifacial photovoltaic solar cells, defining together a direct absorption surface as well as an indirect absorption surface, both surfaces being opposite and intended to absorb a solar radiation energy;
    a support chassis for supporting said cells, said chassis comprising a support structure on which the cells are attached,
    wherein said chassis further includes a suspension means having a top end connected to a first end of the support structure such that the support structure is suspended from the suspension means, and in that the suspension means defines a first reflective surface configured to reflect light towards said indirect absorption surface defined by the plurality of cells, and a second reflective surface configured to reflect light towards another direct absorption surface of another photovoltaic solar energy system located rearwardly of the photovoltaic solar energy system, the second reflective surface facing a direction opposite to a direction that the first reflective surface faces,
    and in that the support chassis further includes an input reflector a first end of which is connected to a bottom end of the suspension means, the input reflector defining a reflective input surface configured to reflect light towards said first reflective surface, and in that said indirect absorption surface, the first reflective surface, as well as the reflective input surface delimit together a light reflection and propagation space open between a second end of the input reflector opposite to the first end of said input reflector, and a second end of the support structure opposite to the first end of said support structure.

2. The system according to claim 1, wherein the support chassis further includes a moving device for pivoting the whole formed by the suspension means and the support structure, and in that the moving device includes a telescopic arm one end of which is hinged to the input reflector.

3. The system according to claim 1, wherein the input reflector, the support structure as well as the suspension means are each of a substantially planar shape, and in that they substantially have the same width along a width direction parallel to junction lines between the support structure, the suspension means, and the input reflector.

4. The system according to claim 1, wherein the input reflector is tilted by an angle substantially equal to 90° with respect to the suspension means, and in that the suspension means is tilted by an angle substantially equal to 45° with respect to the support structure.

5. The system according to claim 4, wherein the input reflector has, between its first and second ends, a first length substantially identical to the length of the suspension means between its top and bottom ends, and in that the support structure has between its first and second ends a second length such that a squared value of the first length is substantially equal to twice the squared value of the second length.

6. The system according to claim 1, wherein said suspension means comprises at least one of the following elements:
- a framework on which a net forming a reflective element is attached;
- a framework on which a set of parallel lamellae forming a reflective element is attached;
- one or more reflective panels, each reflective panel having at least one aperture equipped with wind energy recovering means.

7. A solar power plant comprising a plurality of systems according to claim 1, said systems being arranged so as to form a plurality of rows.

* * * * *